US012604488B2

(12) United States Patent
Chang et al.

(10) Patent No.: US 12,604,488 B2
(45) Date of Patent: Apr. 14, 2026

(54) SILICON CAPACITOR STRUCTURE AND METHOD OF MANUFACTURING THE SAME

(71) Applicant: Powerchip Semiconductor Manufacturing Corporation, Hsinchu (TW)

(72) Inventors: Li-Peng Chang, Hsinchu City (TW); Chih-Ling Hung, Hsinchu County (TW); San-Jung Chang, Hsinchu City (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 556 days.

(21) Appl. No.: 18/116,318

(22) Filed: Mar. 2, 2023

(65) Prior Publication Data

US 2024/0096927 A1     Mar. 21, 2024

(30) Foreign Application Priority Data

Sep. 15, 2022     (TW) .................................. 111134960

(51) Int. Cl.
*H10D 1/68*          (2025.01)
*H01L 21/768*        (2006.01)

(52) U.S. Cl.
CPC ....... *H10D 1/692* (2025.01); *H01L 21/76898* (2013.01)

(58) Field of Classification Search
CPC ... H10D 1/692; H01L 23/5223; H01L 21/486; H01L 21/76898; H01L 23/4982; H01L 23/147; H01L 23/481
See application file for complete search history.

(56) References Cited

U.S. PATENT DOCUMENTS

2017/0098599 A1     4/2017   Zhou
2022/0254872 A1*    8/2022   Park ...................... H01L 23/481

* cited by examiner

*Primary Examiner* — John A Bodnar
(74) *Attorney, Agent, or Firm* — Winston Hsu

(57)     ABSTRACT

The present invention provides a silicon capacitor structure, including a substrate, an interlayer dielectric (ILD) layer on the substrate, a capacitor recess extending from a surface of the ILD layer into the substrate, a capacitor in the capacitor recess, wherein the capacitor includes a bottom electrode on a surface of the capacitor recess, a capacitive dielectric layer on a surface of the bottom electrode, and a top electrode on a surface of the capacitive dielectric layer and filling up the capacitor recess.

9 Claims, 13 Drawing Sheets

SILICON CAPACITOR STRUCTURE AND METHOD OF MANUFACTURING THE SAME

BACKGROUND OF THE INVENTION

1. Field of the Invention

The present invention relates generally to a silicon capacitor structure, and more specifically, to a silicon capacitor manufactured by through-silicon via (TSV) process and method of manufacturing the same.

2. Description of the Prior Art

Capacitor is indispensable component in circuit, which may provide various functions like DC blocking, bypassing, coupling, filtering, temperature compensation, timing, tuning and/or rectifying. Conventional capacitor is usually mounted on a printed circuit board (PCB), such as tantalum capacitor or multi-layer ceramic capacitor (MLCC). As the development of system-on-a-Chip (SoC) technology, power consumption of circuits gets higher and higher and their operating voltages get lower and lower, thus capacitor is required to be set designedly in a position closer to devices in the circuit, which is quite a challenge to the size and density of conventional MLCC. Accordingly, the technology of silicon capacitor emerges as the trend of time. The silicon capacitor is manufactured directly on a semiconductor substrate through advanced semiconductor technology, in comparison to those conventional capacitors which are manufactured in a form of individual passive devices and then mounted on the PCB through surface mounting technology. Therefore, the silicon capacitor may be made thinner and having higher density, which is more suitable for the application of capacitor with high-Q, high frequency in 5G communication and smart vehicle nowadays.

The silicon capacitor nowadays may be broadly divided into two types, wherein one is formed in inter-metal dielectric (IMD) layers and the other is formed in silicon substrate, both of them have their advantages and disadvantages. While the silicon capacitor is designed in IMD layers, its height is limited by the number and thickness of IMD layers. While the silicon capacitor is designed in a silicon substrate, it will be influenced by high temperature environment in semiconductor front-end-of-line (FEOL) process. Both of them have their unfavorable factors. Accordingly, in order to adapt to the development and trend of current silicon capacitor, those of skilled in the art are urged to develop and improve current silicon capacitor structure, in order to solve the aforementioned conventional problems.

SUMMARY OF THE INVENTION

In the light of the aforementioned situation in current conventional skill, the present invention hereby provides a novel silicon capacitor structure and method of manufacturing the same, with feature of the silicon capacitor structure being formed at the same time in through-silicon via (TSV) process after semiconductor front-end-of-line (FEOL) process, without being influenced by the high temperature environment in the FEOL process. The capacitor structure extends from the surface of an interlayer dielectric (ILD) layer into the silicon substrate and is not limited by the number and thickness of inter-metal dielectric (IMD) layers formed in later semiconductor back-end-of-line (BEOL) process.

One aspect of the present invention is to provide a silicon capacitor structure, including a substrate, an ILD layer on the substrate, a capacitor recess extending from a surface of the ILD layer into the substrate, and a capacitor in the capacitor recess, wherein the capacitor includes a bottom electrode on a surface of the capacitor recess, a capacitive dielectric layer on a surface of the bottom electrode, and a top electrode on a surface of the capacitive dielectric layer and filling up the capacitor recess.

Another aspect of the present invention is to provide a method of manufacturing a silicon capacitor structure, including steps of providing a substrate, filling a first bottom electrode material in the substrate, wherein a surface of the first bottom electrode material is flush with a front surface of the substrate, forming semiconductor devices and an ILD layer on the front surface of the substrate, filling a second bottom electrode material in the ILD layer, wherein the second bottom electrode material is connected and aligned with the first bottom electrode material, performing a first etching process to form a through-silicon hole and a capacitor recess, wherein the through-silicon hole extends from the ILD layer into the substrate, and the capacitor recess extends from the second bottom electrode material into the first bottom electrode material, and a depth of the through-silicon hole in the substrate is larger than a depth of the first bottom electrode material in the substrate, and forming a dielectric layer and a metal layer sequentially in the through-silicon hole and the capacitor recess, wherein the dielectric layer and the metal layer in the through-silicon hole constitute a TSV, and the dielectric layer and the metal layer in the capacitor recess and the first bottom electrode material and the second bottom electrode material constitute a capacitor.

These and other objectives of the present invention will no doubt become obvious to those of ordinary skill in the art after reading the following detailed description of the preferred embodiment that is illustrated in the various figures and drawings.

Figure 1:
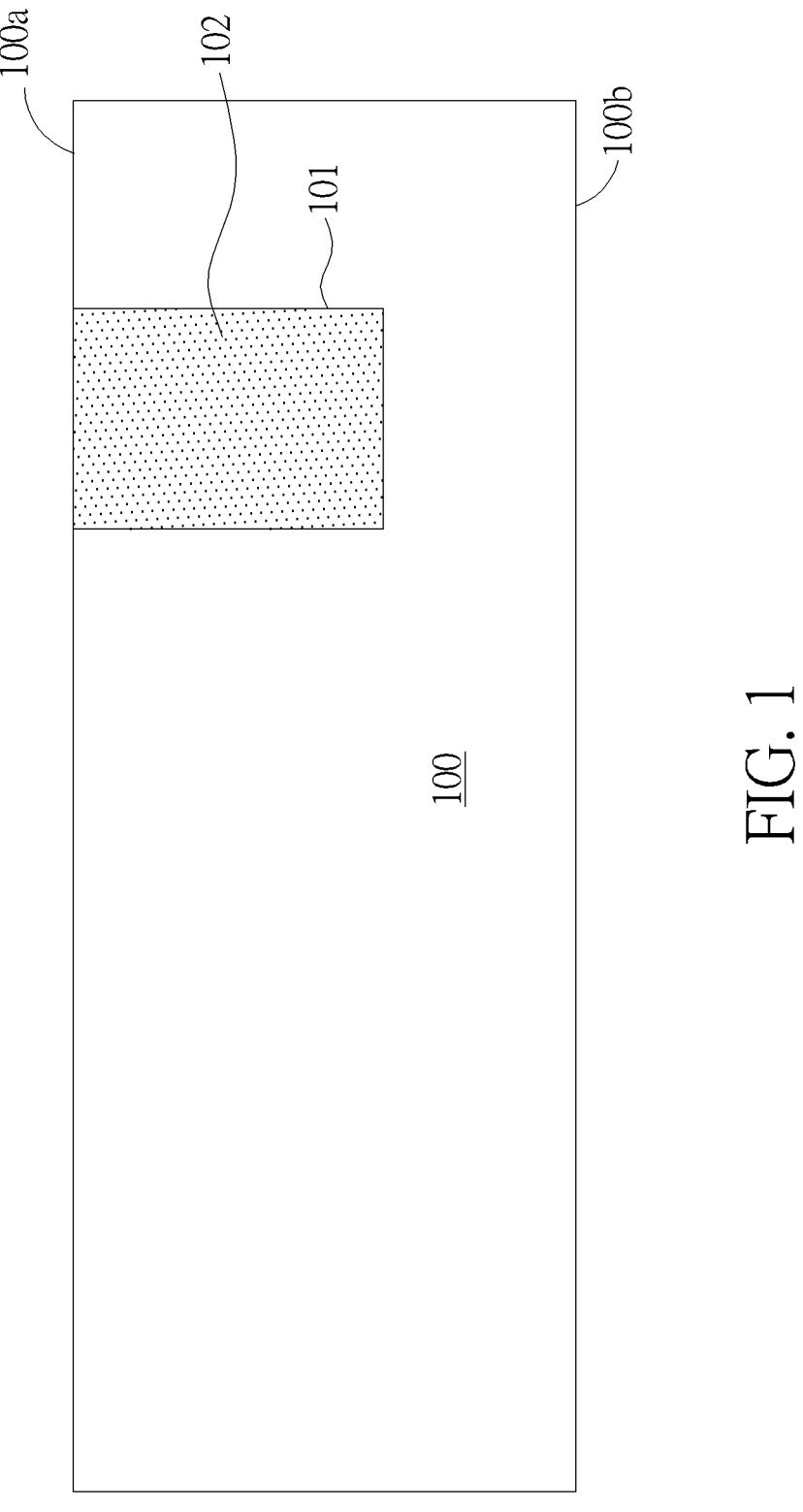
FIG. 1 to FIG. 7 are schematic cross-sectional views illustrating a process flow of manufacturing a silicon capacitor structure in accordance with the preferred embodiment of present invention.

It should be noted that all the figures are diagrammatic. Relative dimensions and proportions of parts of the drawings have been shown exaggerated or reduced in size, for the sake of clarity and convenience in the drawings. The same reference signs are generally used to refer to corresponding or similar features in modified and different embodiments.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something). Further, spatially relative terms, such as "beneath," "below," "lower," "above," "upper," and the like, may be used herein for ease of description to describe one element or feature relationship to another element(s) or feature(s) as illustrated in the figures.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon (Si), germanium (Ge), gallium arsenide (GaAs), indium phosphide (InP), etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. Additionally, the term "based on" may be understood as not necessarily intended to convey an exclusive set of factors, but may allow for the presence of other factors not necessarily expressly described, again depending at least in part on the context.

It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

The process flow of manufacturing a silicon capacitor structure according to the preferred embodiment of present invention will now be described hereinafter with reference to FIG. 1 to FIG. 7. The silicon capacitor structure and through-silicon via (TSV) of the present invention are manufactured in the same process, especially for a type of via middle TSV, i.e. its main process is between semiconductor front-end-of-line (FEOL) process and semiconductor back-end-of-line (BEOL) process. Since the BEOL process is not the key point of present invention, relevant details will not be described in the specification.

First, please refer to FIG. 1. A substrate 100 is provided to serve as a process base for the silicon capacitor structure of present invention. The material of substrate 100 is preferably a silicon substrate, for example a p-type doped silicon substrate. Other silicon-containing substrate may also be adopted in the present invention, including Group III-V-on-silicon (ex. GaN-on-silicon) substrate, silicon-on-insulator (SOI) substrate or substrate of other doping type, but not limited thereto. In other embodiment, the silicon substrate may also be a silicon interposer with through-silicon vias (TSVs), which are formed therein to be used in the application like 2.5D or 3D advanced package or heterogeneous integration.

Refer still to FIG. 1. The substrate 100 is provided with a front surface 100a and an opposite back surface 100b. A photolithography process is first performed from the front surface 100a of substrate 100 to form a first electrode recess 101 in the substrate 100. The photolithography process may be a deep reactive ion etching (DRIE, also referred as Bosch process) process, which uses etching gases like perfluorocyclobutane ($C_4F_8$) and sulphur hexafluoride ($SF_6$) to chemically react with Si-based substrate to form recesses or micro structures with high aspect ratio and excellent anisotropy in the substrate, which is especially suitable for forming through-silicon holes and recess for silicon capacitor necessary in the present invention. In the embodiment, the depth of first electrode recess 101 may be close to the depth of common TSV, but not reach the back surface 100b of substrate 100. Please note that the present invention exemplify only one first electrode recess 101 in the figures for the conciseness of drawings. In real implementation, individual capacitor regions may be defined on the substrate 100, and multiple first electrode recesses 101 may be formed thereon and arranged in a compact array.

Refer still to FIG. 1. After the first electrode recess 101 is formed, a first bottom electrode material 102 is filled in the first electrode recess 101. In the preferred embodiment of present invention, the substrate 100 is p-type doped substrate, and the first bottom electrode material 102 may be n-type doped polysilicon correspondingly, which may be formed in the first electrode recess 101 through the method of LPCVD and in-situ doping. A planarization process, such as a CMP process, may be performed after the first bottom electrode material 102 is filled to remove the first bottom electrode material 102 on the front surface 100a of substrate, so that the first bottom electrode material 102 is completely in the first electrode recess 101 and with its surface flush with the front surface 100a of substrate. In the embodiment of present invention, please note that the aforementioned first bottom electrode material 102 is formed before the semiconductor FEOL process, that is, not any devices or circuit structures are formed on the substrate yet at this stage.

Figure 2:
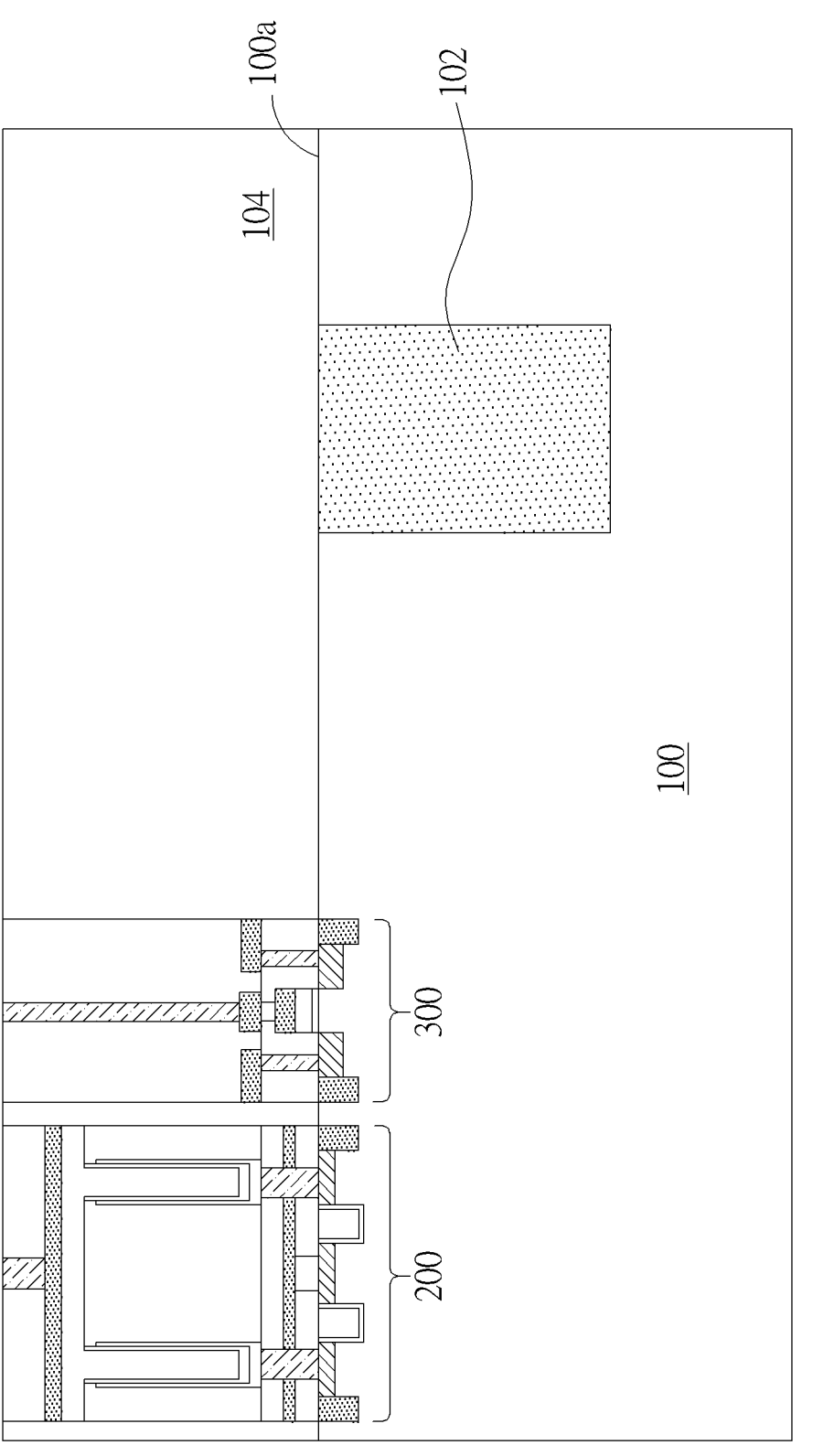

Please refer to FIG. 2. After the first bottom electrode material 102 is formed in the substrate 100, the semiconductor FEOL process is performed to manufacture semiconductor devices on the front surface 100a of substrate, such as memory array 200, peripheral circuit 300 for the memory or logic circuit devices (not shown). Since the FEOL process is conventional and is not the key point of present invention, relevant details will not be described in the specification. After the FEOL process, an interlayer dielectrics (ILD) layer 104 is formed on the substrate 100, covering the first bottom electrode material 102 in the substrate 100 and the aforementioned circuits and devices formed on the substrate, and may be further planarized through a CMP process. The material of ILD layer 104 may be silicon oxide, silicon nitride, silicon oxynitride, spin-on glass (SOG), fluorinated silica glass (FSG) or carbon-doped silicon oxide, etc., which may be formed through PECVD.

Figure 3:
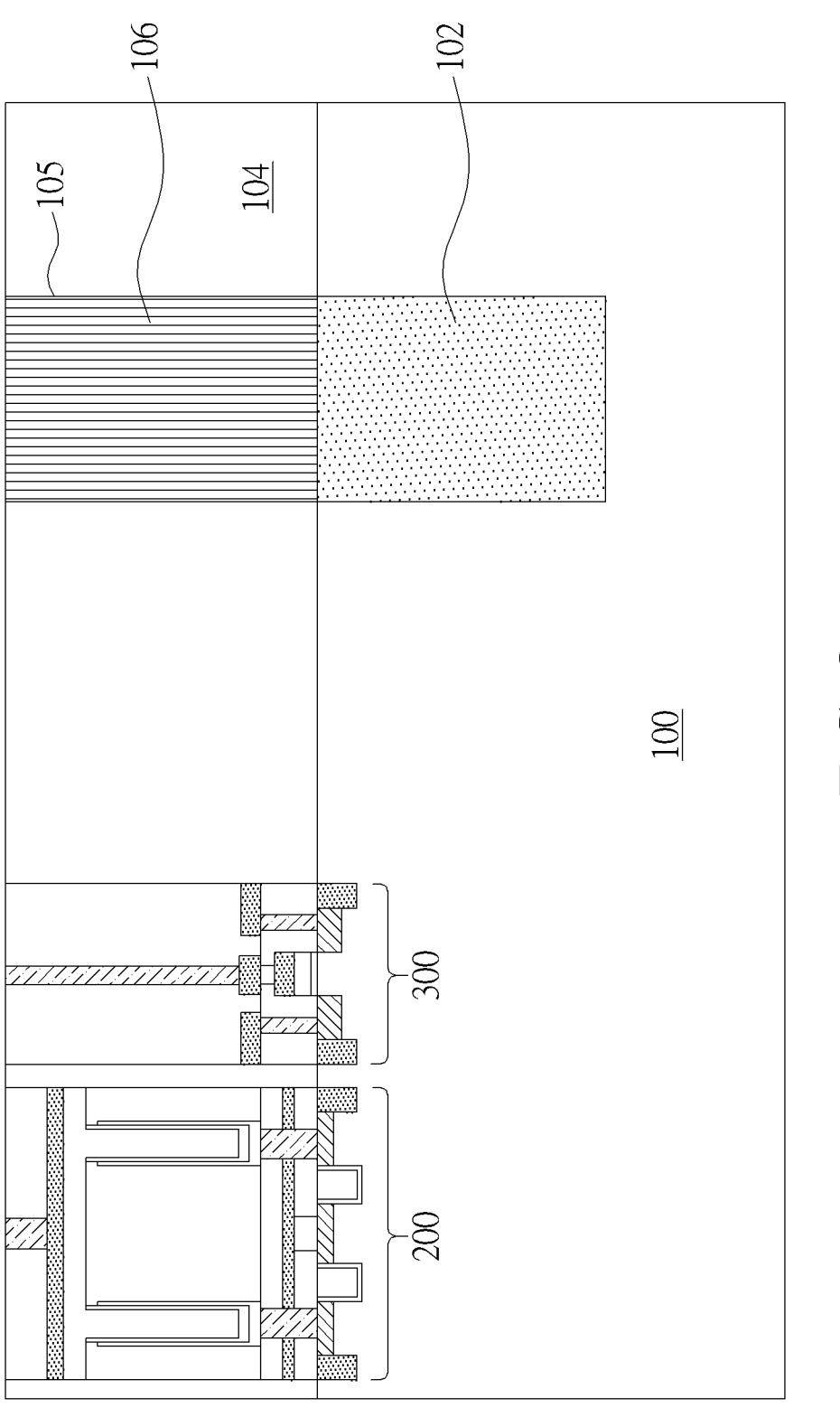

Please refer to FIG. 3. After the FEOL process, a second electrode recess 105 is then formed in the ILD layer 104. Similarly, the second electrode recess 105 may be formed through DRIE process. The second electrode recess 105 may expose and be aligned with the first bottom electrode material 102 below in a direction vertical to the substrate by using the same photomask as the one in the photolithography process of forming the first electrode recess 101. After the second electrode recess 105 is formed, a second bottom electrode material 106 is then filled in the second electrode recess 105. In the preferred embodiment of present invention, the second bottom electrode material 106 may be n-type doped polysilicon. Similarly, the second bottom electrode material 106 may be formed in the second electrode recess 105 by using LPCVD and in-situ doping. A planarization process, such as a CMP process, may be performed after the second bottom electrode material 106 is filled, to remove the second bottom electrode material 106 on the surface of ILD layer 104, so that the second bottom electrode material 106 is completely in the second electrode recess 105 and with its surface flush with the surface of ILD layer 104. In the embodiment of present invention, the first bottom electrode material 102 and the second bottom electrode material 106 constitute collectively the bottom electrode material of silicon capacitor structure in the present invention, with its vertical range covering the whole ILD layer 104 and parts of the substrate 100.

Figure 4:
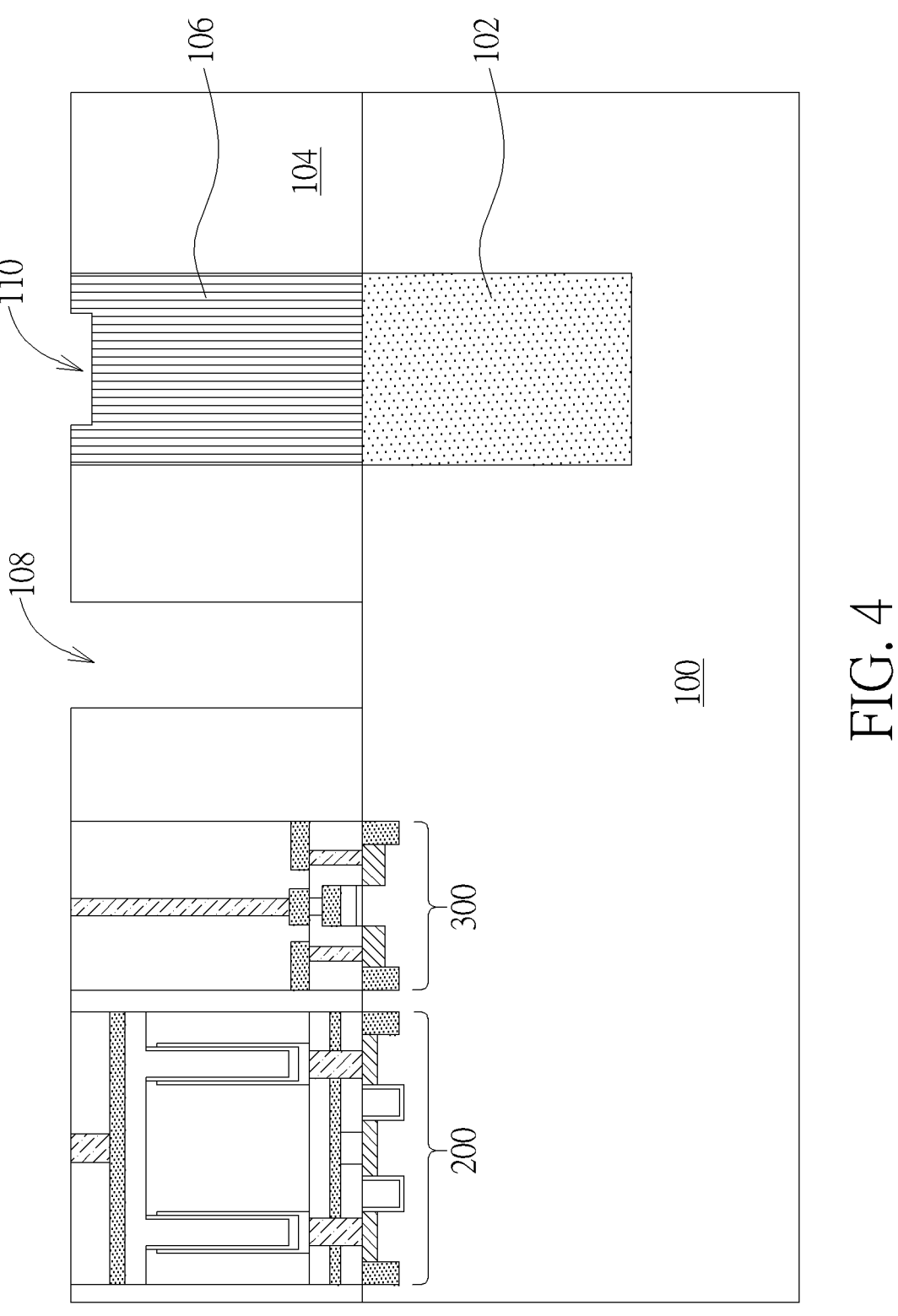

Please refer to FIG. 4. After the second bottom electrode material 106 is filled, another photolithography process is then performed, which may DRIE process similarly to form through-silicon hole 108 in the ILD layer 104. Please note that in the embodiment of present invention, as shown in the figure, the photolithography process simultaneously form a capacitor recess 110 on the second bottom electrode material 106. The capacitor recess 110 is preferably at the center of horizontal plane of the second bottom electrode material 106. Since materials etched at the two positions are different (ex. silicon oxide and polysilicon respectively), the depths of through-silicon hole 108 and the capacitor recess 110 formed in this etching process will be different. In the embodiment of present invention, when the through-silicon hole 108 is etched to the surface of substrate 100, the capacitor recess 10 will only be etched to a slight depth since the etching rate there is lower.

Figure 5:
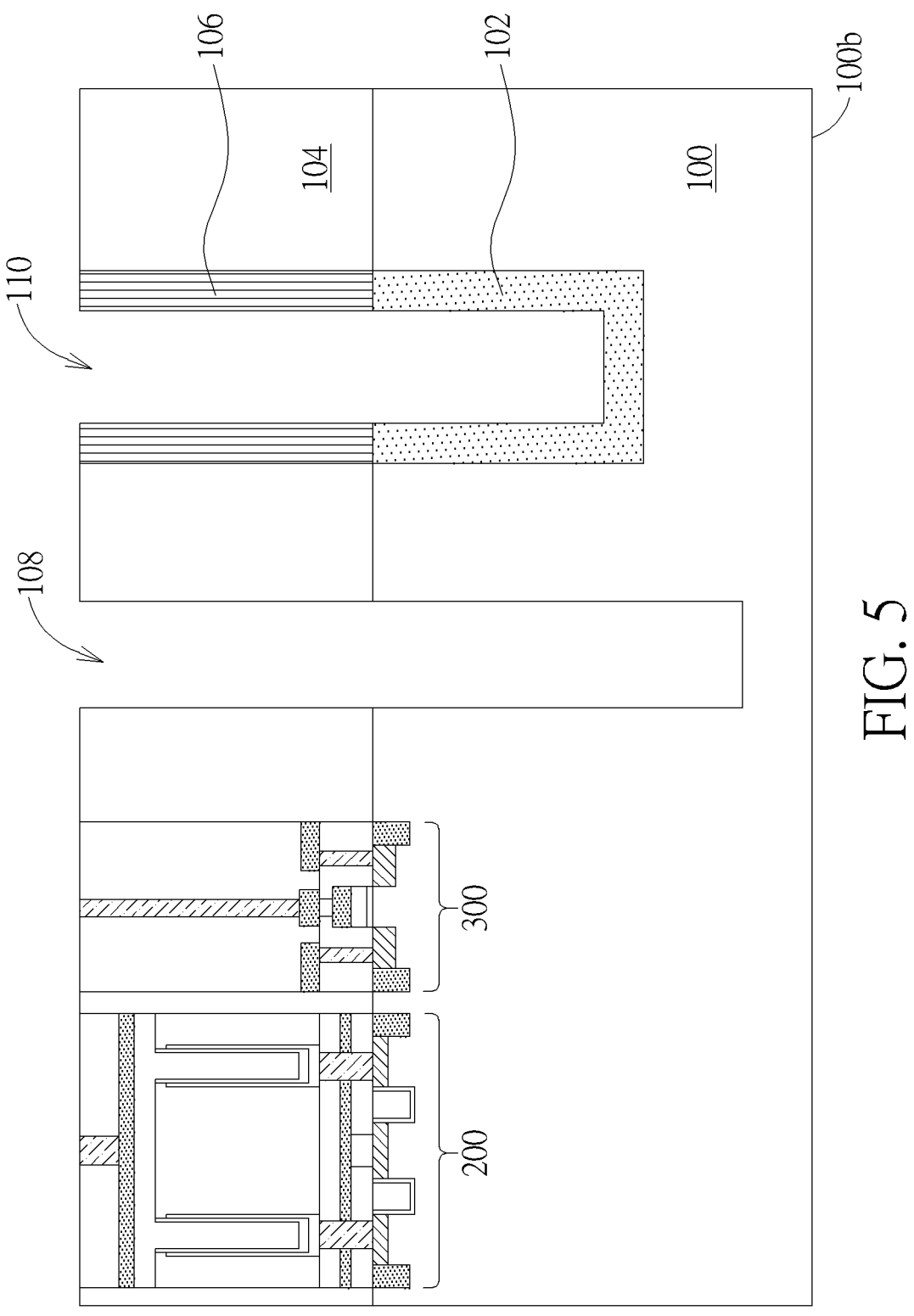

Please refer to FIG. 5. This figure follows previous etching process of FIG. 4. The through-silicon hole 108 is etched to the depth close to the back surface 100b of substrate in the same etching process, while the capacitor recess 110 is etched out through the second bottom electrode material 106 and extends into the first bottom electrode material 102, but it is designedly not etched through the whole first bottom electrode material 102, so that the first bottom electrode material 102 will still remain on the bottom surface of the capacitor recess 110 in order to increase capacitance. Since the materials of two holes at this stage are both silicon, the depth of through-silicon hole 108 in the substrate 100 is generally close to the depth of entire capacitor recess 110, however, the depth of entire through-silicon hole 108 is larger than the depth of capacitor recess 110. In the embodiment of present invention, the part of capacitor recess 110 in the substrate 100 (including its bottom surface) is surrounded by the first bottom electrode material 102, and the part of capacitor recess 110 in the ILD layer 104 is surrounded by the second bottom electrode material 106.

Figure 6:
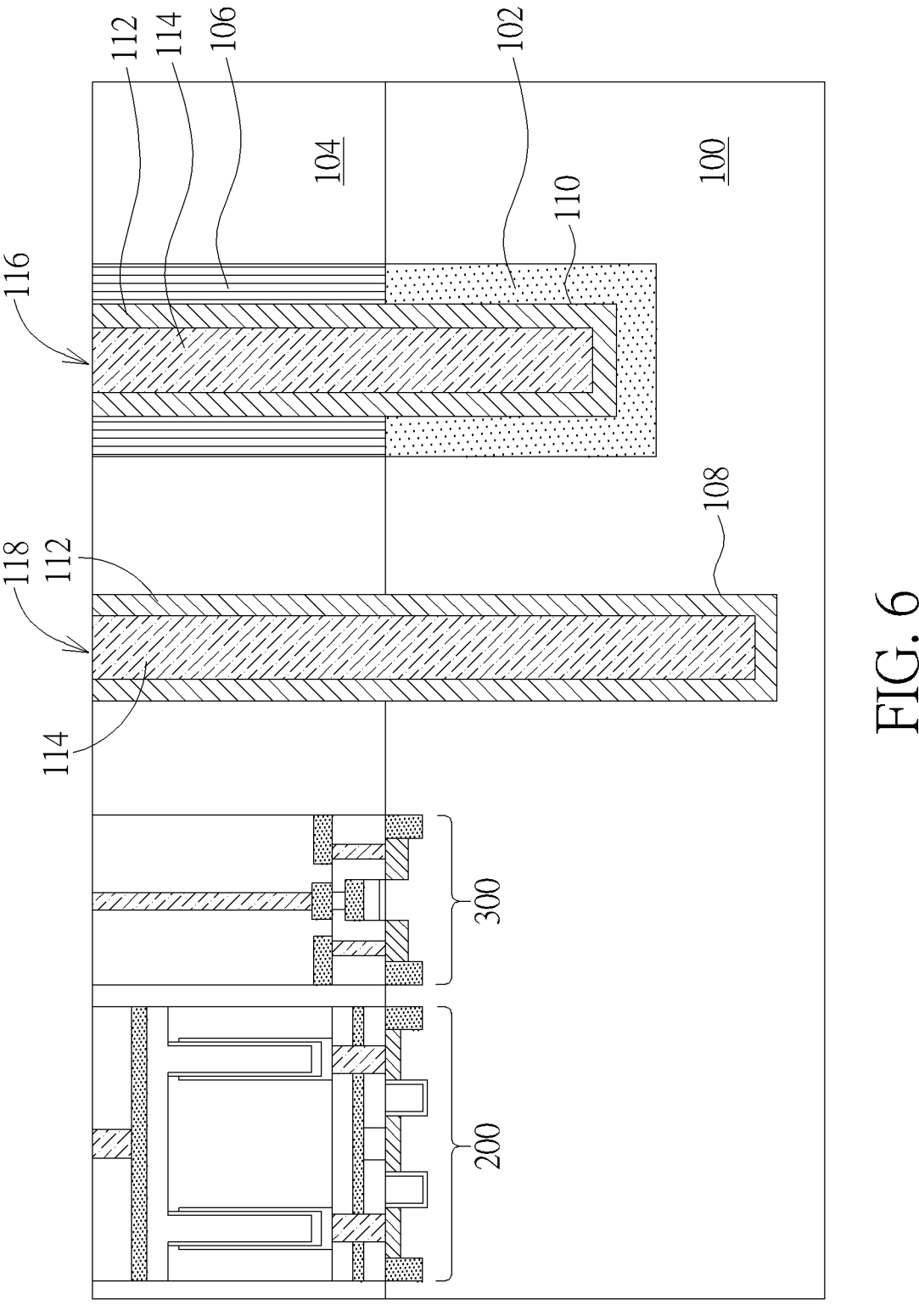

Please refer to FIG. 6. After the through-silicon hole 108 and capacitor recess 110 are formed, a dielectric layer 112 and a metal layer 114 are formed sequentially in the through-silicon hole 108 and capacitor recess 110, wherein the dielectric layer 112 is conformally formed on the surface of through-silicon hole 108 and capacitor recess 110, while the metal layer 114 fills up the through-silicon hole 108 and capacitor recess 110, with its part on the surface of ILD layer 104 being removed through a planarization process. The material of dielectric layer 112 may be dielectrics like silicon oxide, silicon nitride, aluminum oxide or aluminum-hafnium oxide ($HfAlO_x$), which may be formed conformally in the through-silicon hole 108 and capacitor recess 110 through atomic layer deposition (ALD) process, wherein the dielectric layer 112 in the capacitor recess 110 is capacitive dielectric layer. The material of metal layer 114 may be metal like copper (Cu), tantalum (Ta), tungsten (w) or aluminum (Al), which may be formed and fill up the through-silicon hole 108 and capacitor recess 110 through PVD process. In the preferred embodiment of present invention, the dielectric layer 112 and metal layer 114 in the through-silicon hole 108 constitute a through-silicon via (TSV) 118, while the dielectric layer 112 and metal layer 114 in the capacitor recess 110 constitute a capacitor 116 collectively with the first bottom electrode material 102 and the second bottom electrode material 106. Since the TSV 118 in this embodiment is manufactured after the FEOL process and before the BEOL process, the TSV 118 is a type of via middle TSV. The TSV 118 and capacitor 116 both extend from the surface of ILD layer 104 into the substrate 100 through the ILD layer 104.

Figure 7:
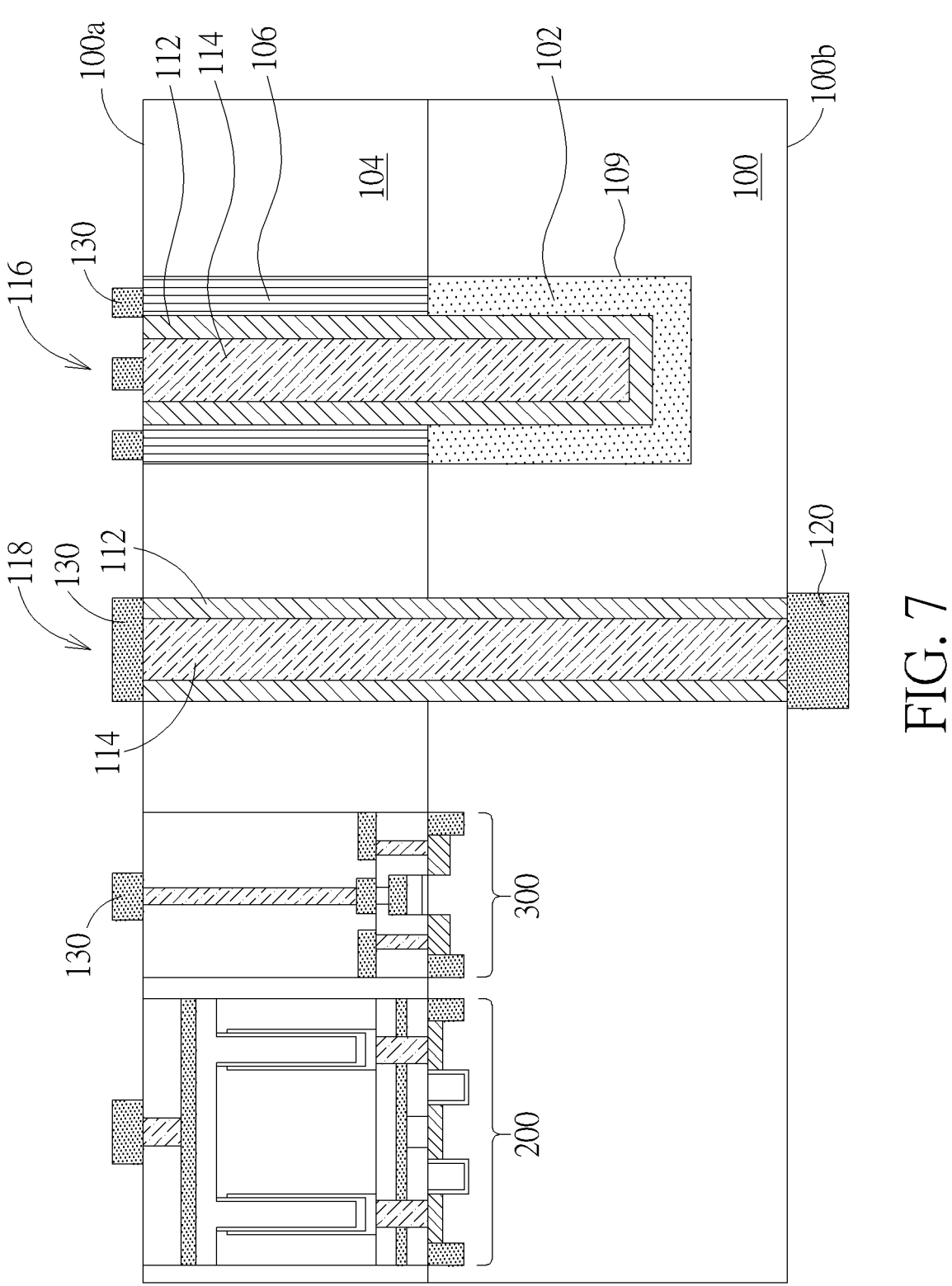

Please refer to FIG. 7. After the TSV 118 and the capacitor 116 are formed, a backside grinding process is then performed from the back surface 100b of substrate to remove a predetermined thickness of the substrate 100, so as to expose the metal layer 114 of TSV 118 in the substrate 100. In the embodiment of present invention, since the depth of capacitor 116 is smaller than the depth of TSV 118, the backside grinding process may be controlled designedly to expose only the TSV 118 without exposing the capacitor 116. In this way, the TSV 118 would connect the surface of ILD layer 104 and the back surface 100b of substrate 100, while the capacitor 116 extends into the substrate 100 until a predetermined depth from the surface of ILD layer 104 is reached. After the backside grinding process, a redistribution layer (RDL) 120 is then formed on the back surface 100b of substrate. The material of redistribution layer 120 may be copper (Cu) or aluminum (Al), which may be formed through PVD process and patterned through photolithography process. In the embodiment of present invention, the redistribution layer 120 is electrically connected with the TSV 118 to extend electrical connections on the horizontal plane and redistribute layouts of I/O ports, or to be placed with solder balls to connect with other wafer or substrate. In this way, the TSV and the silicon capacitor structure of present invention are completed concurrently.

After the TSV and the silicon capacitor structure are completed, the semiconductor BEOL process may be performed to manufacture metal interconnects 130 on the ILD layer 104, or the substrate 100 may be bonded with other substrate or wafer. Since the BEOL process and wafer bonding process are not the key point of present invention, relevant details will not be described in case of obscuring the focus of present invention.

According to the aforementioned embodiment of method, it can be understood that the silicon capacitor structure of present invention may be manufactured and integrated simultaneously in the TSV process after semiconductor FEOL process without adding too many additional process steps and being influenced by the high temperature environment of the FEOL process. In another aspect, the silicon capacitor structure of present invention has long vertical length extending right into the silicon substrate from the surface of ILD layer, thus it is not limited by factors like the number and thickness of inter-metal dielectric (IMD) layers in the semiconductor BEOL process, therefore higher capacitance may be achieved.

According to the aforementioned embodiment of method, the present invention hereby also provides a novel silicon capacitor structure as shown in FIG. 7, including a substrate 100, a ILD layer 104 on the substrate 100, a capacitor recess 109 extending from the surface of ILD layer 104 into the substrate 100, a capacitor 116 in the capacitor recess 109, wherein the capacitor 116 includes a bottom electrode (i.e. the first bottom electrode material 102 and the second bottom electrode material 106) on the surface of capacitor recess 109, a capacitive dielectric layer 112 on the surface of bottom electrode, and a top electrode (i.e. the metal layer 114) on the surface of capacitive dielectric layer 112 and filling up the capacitor recess 109.

Figure 8:
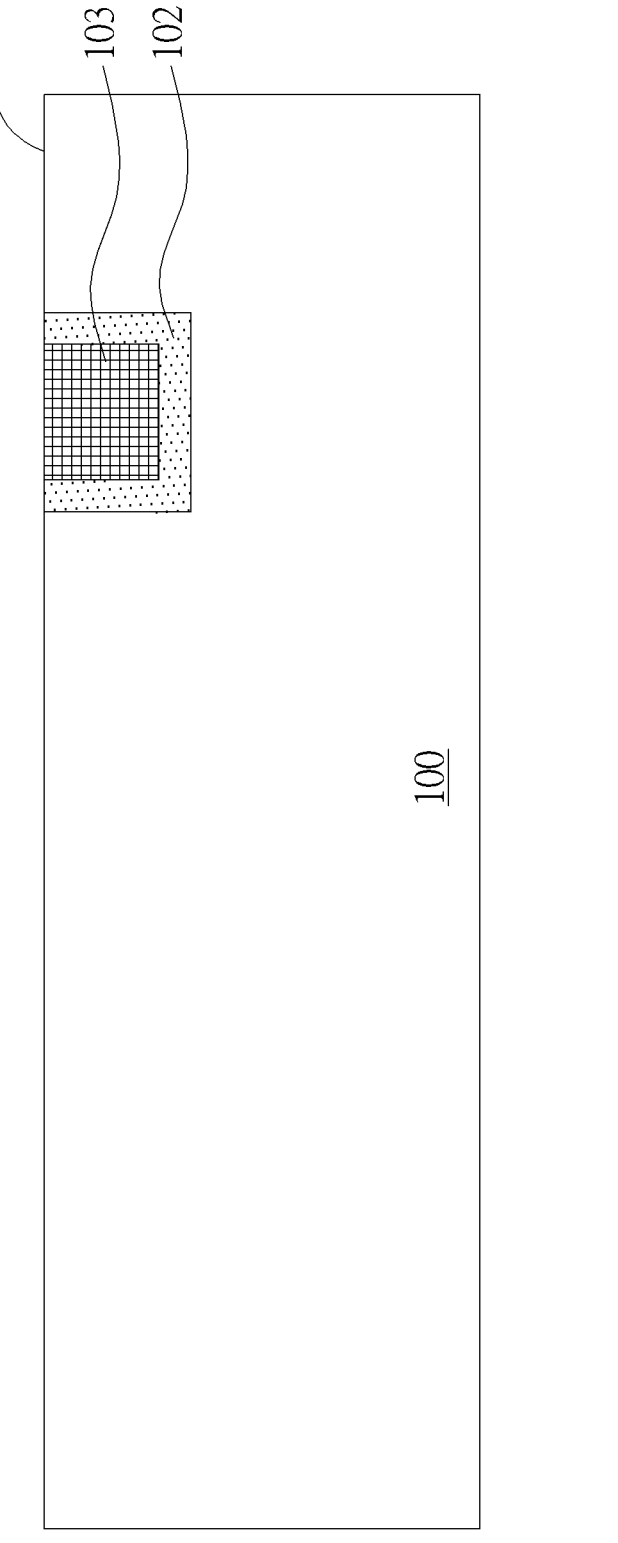
FIG. 8 to FIG. 10 are schematic cross-sectional views illustrating a process flow of manufacturing a silicon capacitor structure in accordance with another embodiment of present invention.

The process flow of manufacturing a silicon capacitor structure according to another embodiment of the present invention will now be described hereinafter with reference to FIG. 8 to FIG. 10. Firstly in FIG. 8, similar to the steps of FIG. 1, a first bottom electrode material 102 is filled in the substrate 100. In this embodiment, a sacrificial layer 103 is further formed in the first bottom electrode material 102 to function as a stop layer in later etching process. The sacrificial layer 103 may be formed by performing a photolithography process to form a recess on the first bottom electrode material 102 and then filling in the material, wherein the filled material may be material with distinct etching selectivity to polysilicon, such as silicon oxide. The sacrificial layer 103 is generally at a central position on the horizontal plane of first bottom electrode material 102, i.e. the position where the capacitor recess is formed later.

Figure 9:
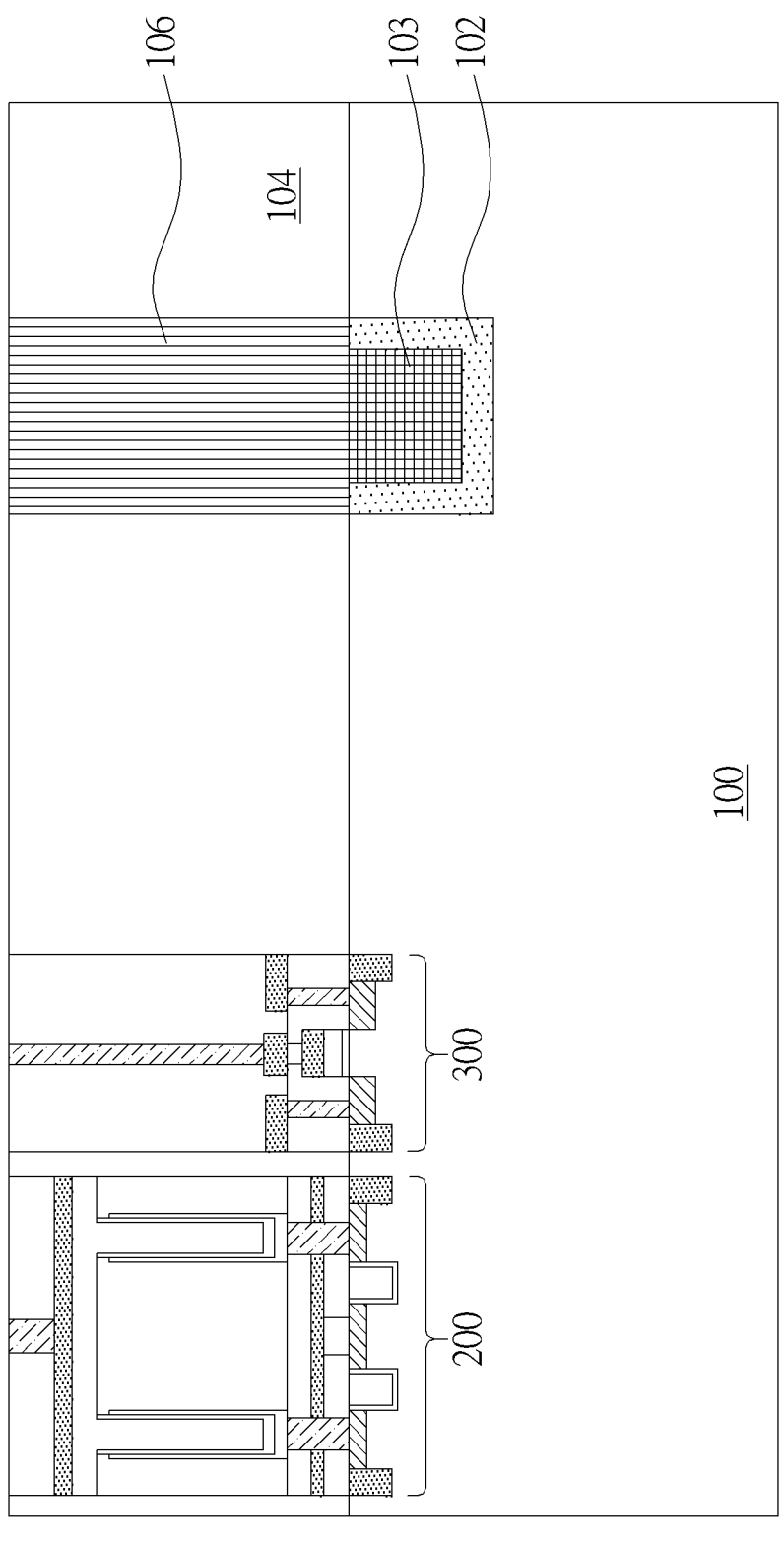

Please refer to FIG. 9. As shown in the steps of FIG. 2 and FIG. 3, a semiconductor FEOL process is then performed to manufacture semiconductor devices on the front surface 100a of substrate, for example memory array 200, peripheral circuit 300 of memory or logic circuit devices (not shown), and the second bottom electrode material 106 is form in the ILD layer 104. The second bottom electrode material 106 is aligned with the first bottom electrode material 102 in the vertical direction and covers the sacrificial layer 103.

Figure 10:
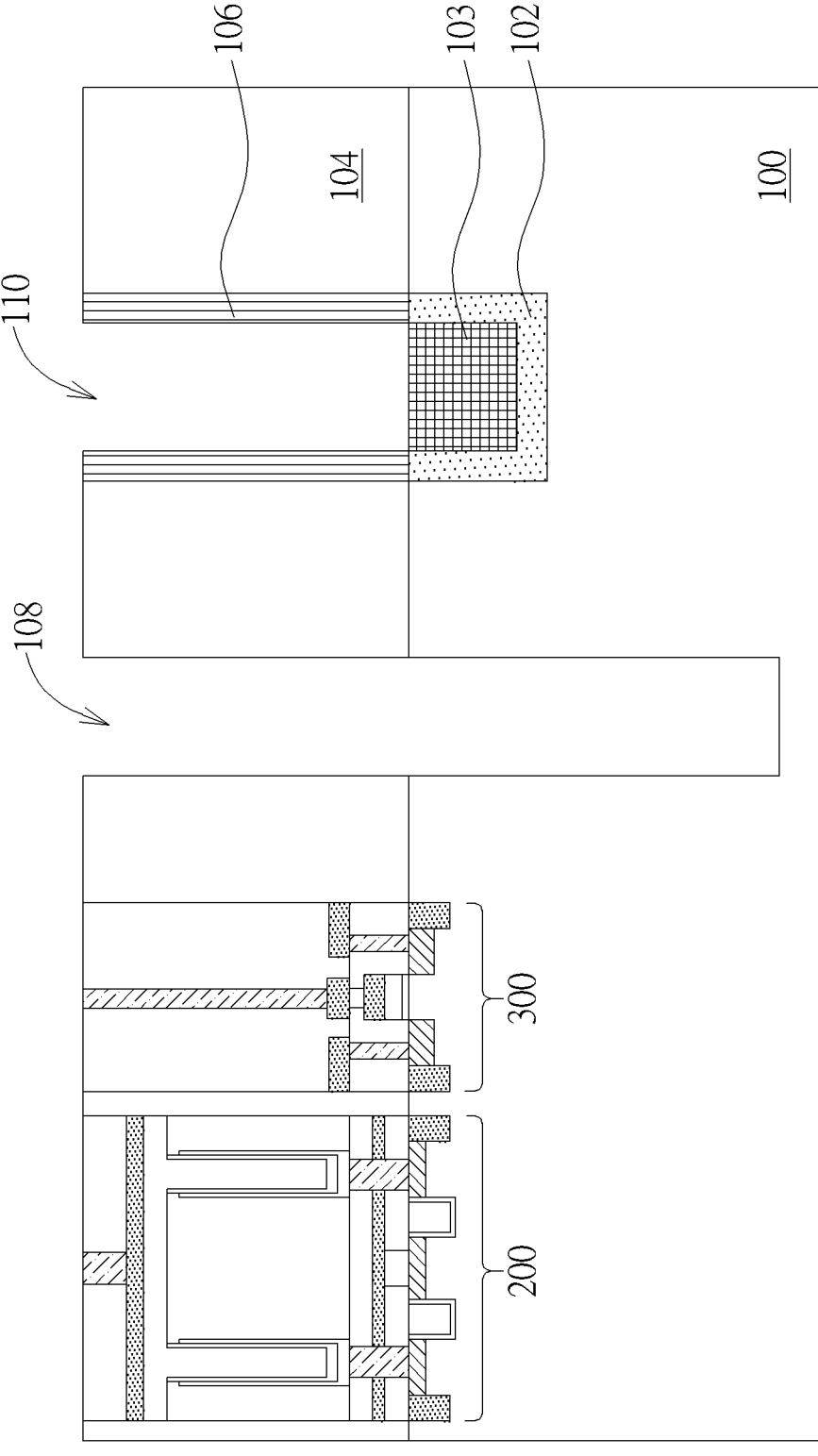

Please refer to FIG. 10. As shown in the steps of FIG. 4 and FIG. 5, a photolithography process is then performed to form a through-silicon hole 108 in the ILD layer 104 and capacitor recess 110 in the second bottom electrode material

106. In this embodiment, the second bottom electrode material 106 is etched till to the sacrificial layer 103 below. Since the sacrificial layer 103 functions as an etch stop layer in this etching step, parameters of the etching process may be easily controlled to form uniform, straight cross-sectional profile of recess with high aspect ratio. Thereafter, an etching process may be further performed to remove the remaining sacrificial layer 103, so as to form complete capacitor recess 110 extending into the substrate 100. The processes later are shown as the ones in FIG. 4 and FIG. 7, which will not be herein repeated.

Figure 11:
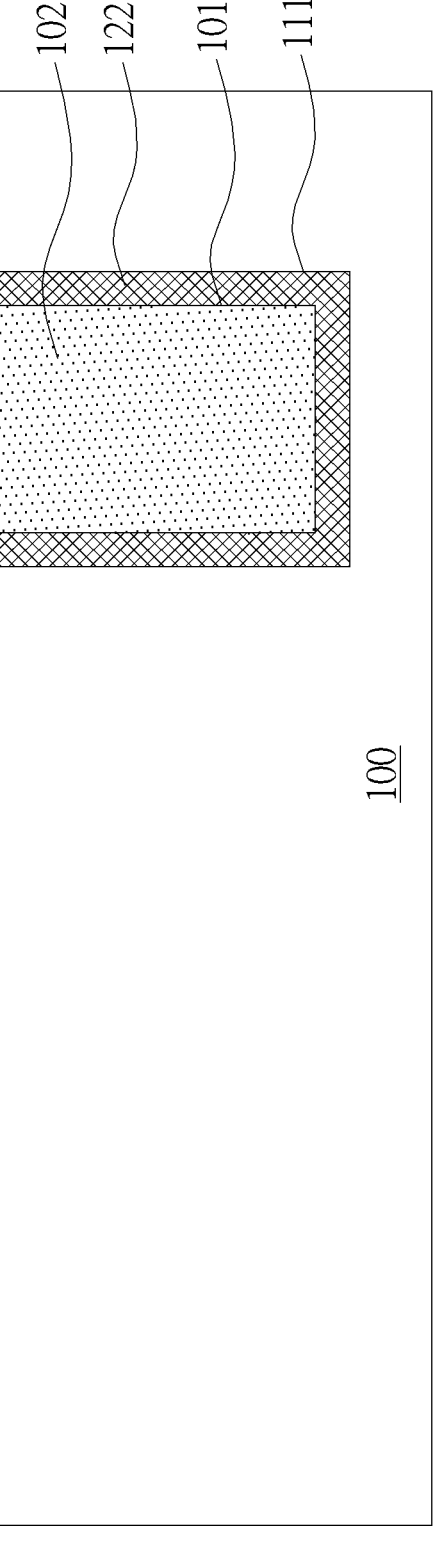
FIG. 11 to FIG. 13 are schematic cross-sectional views illustrating a process flow of manufacturing a silicon capacitor structure in accordance with still another embodiment of present invention.

The process flow of manufacturing a silicon capacitor structure according to still another embodiment of the present invention will now be described hereinafter with reference to FIG. 11 to FIG. 13. First in FIG. 11, before the first bottom electrode material 102 is formed, an insulating layer 122 is formed in advance in the substrate 100, and the surface of insulating layer 122 is flush with the front surface 100a of substrate. The insulating layer 122 may be formed by first forming a recess 111 in the substrate 100 and then filling in the material, wherein the material may be silicon oxide. After the insulating layer 122 is formed, as shown in the step of FIG. 1, the first bottom electrode material 102 is filled in the insulating layer 122. The first bottom electrode material 102 may be formed by first forming a first electrode recess 101 on the insulating layer 122 and then filling in the material. The horizontal width of recess 111 is larger than the horizontal width of first electrode recess 101. The first bottom electrode material 102 is generally at a central position on the horizontal plane of insulating layer 122, while the insulating layer 122 is transformed into a liner between the first bottom electrode material 102 and substrate 100.

Figure 12:
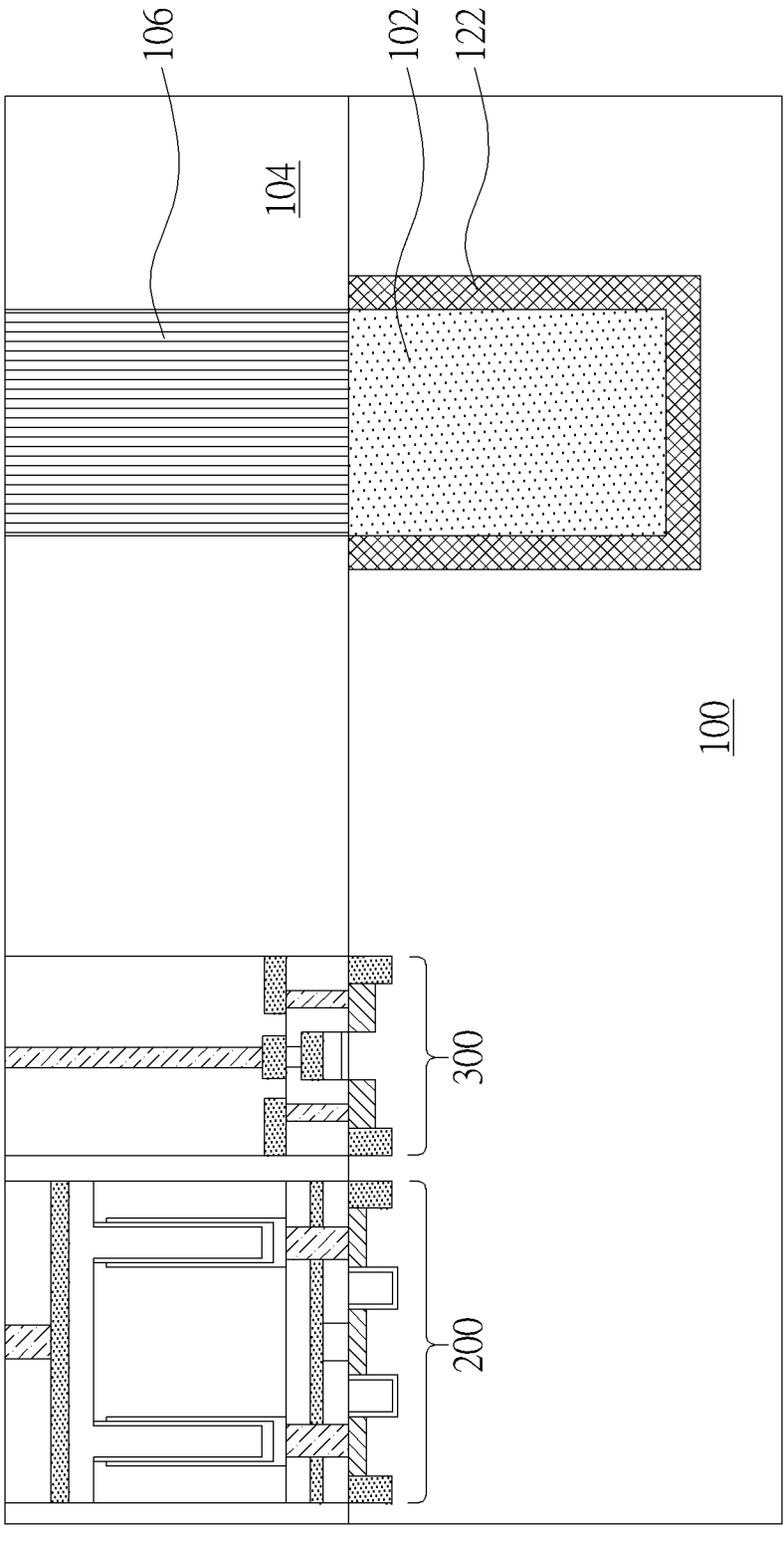

Please refer to FIG. 12. Similar to the steps of FIG. 2 and FIG. 3, a semiconductor FEOL process is then performed to manufacture semiconductor devices on the front surface 100a of substrate, for example memory array 200, peripheral circuit 300 of memory or logic circuit devices (not shown), and the second bottom electrode material 106 is formed in the ILD layer 104. The second bottom electrode material 106 is aligned with and covers the first bottom electrode material 102 in the vertical direction.

Figure 13:
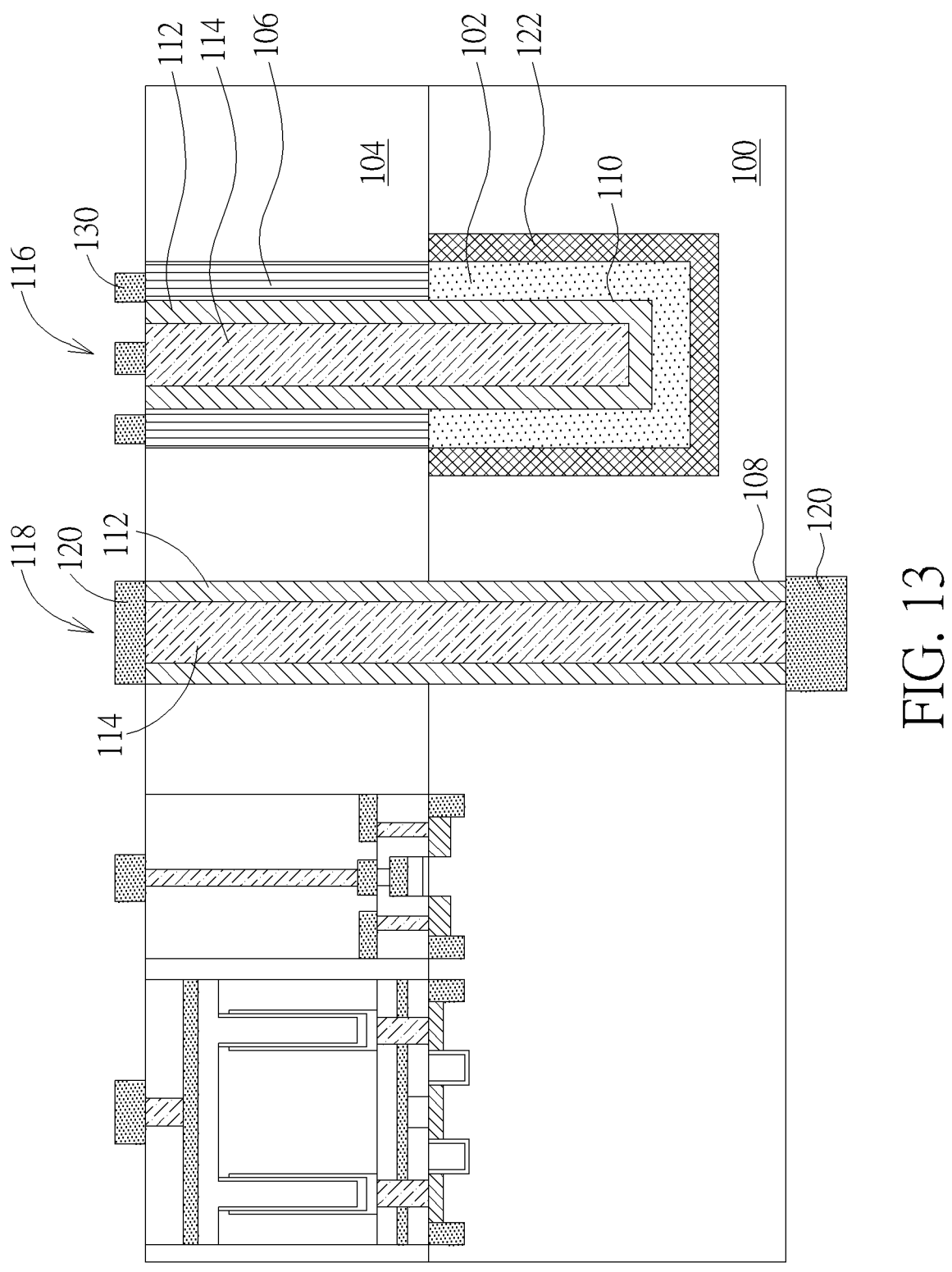

Please refer to FIG. 13. Similar to the steps of FIG. 4 and FIG. 7, a photolithography process is then performed to form a through-silicon hole 108 in the ILD layer 104 and capacitor recess 110 in the second bottom electrode material 106 and the first bottom electrode material 102. Thereafter, a dielectric layer 112 and a metal layer 114 are formed sequentially in the through-silicon hole 108 and capacitor recess 110, so as to form the TSV and the silicon capacitor structure of present invention. Lastly, a backside grinding process is performed to expose the metal layer 114 of TSV 118 on the back surface 100b of substrate, and redistribution layers 120 are then formed to connect the TSV 118. Metal interconnects 130 may be further formed on the ILD layer 104 in later process to connect with the capacitor 116 and the TSV 118. In this embodiment, since the insulating layer 122 is isolated between the first bottom electrode material 102 of capacitor 116 and the substrate 100, leakage between the first bottom electrode material 102 and substrate 100 having the same Si-based material may be avoided.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of manufacturing a silicon capacitor structure, comprising:

providing a substrate;

filling a first bottom electrode material in said substrate, wherein a surface of said first bottom electrode material is flush with a front surface of said substrate;

forming semiconductor devices and an interlayer dielectric (ILD) layer on said front surface of said substrate;

filling a second bottom electrode material in said ILD layer, wherein said second bottom electrode material is connected and aligned with said first bottom electrode material;

performing a first etching process to form a through-silicon hole and a capacitor recess, wherein said through-silicon hole extends from said ILD layer into said substrate, and said capacitor recess extends from said second bottom electrode material into said first bottom electrode material, and a depth of said through-silicon hole in said substrate is larger than a depth of said first bottom electrode material in said substrate; and forming a dielectric layer and a metal layer sequentially in said through-silicon hole and said capacitor recess, wherein said dielectric layer and said metal layer in said through-silicon hole constitute a through-silicon via (TSV), and said dielectric layer and said metal layer in said capacitor recess and said first bottom electrode material and said second bottom electrode material constitute a capacitor.

2. The method of manufacturing a silicon capacitor structure of claim 1, further comprising performing a backside grinding process after forming said TSV to expose said metal layer of said TSV from a back surface of said substrate without exposing said first bottom electrode material.

3. The method of manufacturing a silicon capacitor structure of claim 2, further comprising forming redistribution layers on said back surface of said substrate after said backside grinding process, and said redistribution layers are electrically connected with said TSV.

4. The method of manufacturing a silicon capacitor structure of claim 1, wherein steps of filling said first bottom electrode material comprise:

performing a second etching process to form a first electrode recess in said substrate; and forming said first bottom electrode material in said first electrode recess.

5. The method of manufacturing a silicon capacitor structure of claim 1, wherein steps of filling said second bottom electrode material comprise:

performing a third etching process to form a second electrode recess in said ILD layer, and said second electrode recess exposes said first bottom electrode material and is aligned with said first bottom electrode material; and forming said second bottom electrode material in said second electrode recess.

6. The method of manufacturing a silicon capacitor structure of claim 1, further comprising forming a sacrificial layer in said first bottom electrode material, wherein said first etching process etches said second bottom electrode material till to said sacrificial layer.

7. The method of manufacturing a silicon capacitor structure of claim 6, further comprising removing said sacrificial layer to form said capacitor recess.

8. The method of manufacturing a silicon capacitor structure of claim 1, further comprising:

filling an insulating layer in said substrate before said first bottom electrode material is formed, wherein a surface of said insulating layer is flush with said front surface of said substrate; and filling said first bottom electrode material in said insulating layer.

9. The method of manufacturing a silicon capacitor structure of claim 1, further comprising forming metal interconnects on said ILD layer after said capacitor and said through-silicon hole are formed, and said metal interconnects are electrically connected with said through-silicon hole, said capacitor and said semiconductor devices.

* * * * *